(12) United States Patent
Motojima (10) Patent No.: US 10,573,402 B2
(45) Date of Patent: Feb. 25, 2020

(54) SEMICONDUCTOR APPARATUS (71) Applicant: DENSO CORPORATION, Kariya, Aichi-pref. (JP)

(72) Inventor: Mutsuya Motojima, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/249,986

(22) Filed: Jan. 17, 2019

(65) Prior Publication Data

US 2019/0147970 A1 May 16, 2019

Related U.S. Application Data

(63) Continuation of application No. PCT/JP2017/027786, filed on Jul. 27, 2017.

(30) Foreign Application Priority Data

Aug. 25, 2016 (JP) .................. 2016-164650

(51) Int. Cl.
| | | |
|---|---|---|
| G11C 29/50 | (2006.01) | |
| G11C 29/38 | (2006.01) | |
| G11C 29/14 | (2006.01) | |
| G06F 11/22 | (2006.01) | |
| G01R 31/3185 | (2006.01) | |
| G01R 31/28 | (2006.01) | |
| G01R 31/317 | (2006.01) | |
| G11C 7/10 | (2006.01) | |
| G11C 7/24 | (2006.01) | |

(52) U.S. Cl.
CPC .............. *G11C 29/38* (2013.01); *G01R 31/28* (2013.01); *G01R 31/3185* (2013.01); *G01R 31/31701* (2013.01); *G06F 11/22* (2013.01); *G11C 7/1096* (2013.01); *G11C 7/24* (2013.01); *G11C 29/14* (2013.01)

(58) Field of Classification Search
CPC ...................................................... G11C 29/50
USPC ................................................. 365/226, 201
See application file for complete search history.

(56) References Cited

U.S. PATENT DOCUMENTS

| | | | |
|---|---|---|---|
| 4,556,851 A * | 12/1985 | Levine .............. | H01L 27/14831 257/E27.154 |
| 4,979,172 A | 12/1990 | Murase et al. | |
| 7,313,048 B2 * | 12/2007 | Ishikawa .................. | H03K 5/19 327/538 |
| 2011/0063017 A1 | 3/2011 | Ishikawa | |

FOREIGN PATENT DOCUMENTS

| | | |
|---|---|---|
| JP | H09-166648 A | 6/1997 |
| JP | 2000-132999 A | 5/2000 |
| JP | 2010-055676 A | 3/2010 |

* cited by examiner

*Primary Examiner* — Jason Lappas
(74) *Attorney, Agent, or Firm* — Posz Law Group, PLC (57) ABSTRACT

A semiconductor apparatus includes a nonvolatile memory therein and an input terminal configured to receive a test control signal and an input signal of a writing/erasing voltage from an external device. The semiconductor apparatus includes: an output terminal; a positive pulse detection circuit configured to detect a positive test control signal, and output the positive test control signal to the output terminal; and a negative pulse detection circuit configured to detect a negative test control signal, and output the negative test control signal to the output terminal after inverting.

4 Claims, 10 Drawing Sheets

| INPUT TERMINAL A | $Vin > Vth+$ | $Vth+ \geq Vin \geq Vth-$ | $Vth- > Vin$ |
|---|---|---|---|
| OUTPUT TERMINAL B | H | L | H |

FIG. 3

(a) INPUT SIGNAL Vin(V) INPUT TERMINAL A (b) TEST CONTROL SIGNAL OUTPUT TERMINAL B

TEST MODE SHIFT MALFUNCTION PREVENTION

FIG. 4

TEST MODE SHIFT MALFUNCTION PREVENTION

FIG. 5

TEST MODE SHIFT MALFUNCTION PREVENTION

SEMICONDUCTOR APPARATUS

CROSS REFERENCE TO RELATED APPLICATIONS

The present application is a continuation application of International Patent Application No. PCT/JP2017/027286 filed on Jul. 27, 2017, which designated the U.S. and claims the benefit of priority from Japanese Patent Application No. 2016-164650 filed on Aug. 25, 2016. The entire disclosures of all of the above applications are incorporated herein by reference.

TECHNICAL FIELD

The present disclosure relates to a semiconductor apparatus.

BACKGROUND

In a nonvolatile memory element or a semiconductor apparatus including a nonvolatile memory, a single terminal may be provided as an input terminal for a memory writing high voltage application as well as a test input.

SUMMARY

The present disclosure provides a semiconductor apparatus having a nonvolatile memory therein and an input terminal configured to externally receive a test control signal and an input signal of a writing/erasing voltage for the nonvolatile memory.

BRIEF DESCRIPTION OF DRAWINGS

The above and other objects, features and advantages of the present disclosure will become more apparent from the following detailed description made with reference to the accompanying drawings, in which.

DETAILED DESCRIPTION

In a nonvolatile memory element or a semiconductor apparatus including a nonvolatile memory, a single terminal may be provided as an input terminal for a high voltage application for writing in the memory as well as an input for a test control signal.

As a comparative example, there is known a configuration in which a test terminal needs to be fixed to a low voltage level when switching to a test mode is not performed. In such a configuration, in writing in a memory, a high voltage detection circuit detects that the test terminal is at a predetermined high voltage, and a test output is set to a low level (GND) through a transistor. In this case, the switching to the test mode and the application of the memory writing voltage cannot be simultaneously performed. In addition, such an apparatus is not addressed to a case where the memory writing voltage is a negative voltage, it is not easy to use it.

According to an aspect of the present disclosure, a semiconductor apparatus includes a nonvolatile memory therein and an input terminal configured to receive a test control signal and an input signal of a writing/erasing voltage for the nonvolatile memory from an external device. The semiconductor apparatus includes: an output terminal configured to output a signal to another circuit provided in the semiconductor apparatus; a positive pulse detection circuit configured to detect a positive test control signal received at the input terminal, and output the positive test control signal to the output terminal; and a negative pulse detection circuit configured to detect a negative test control signal received at the input terminal, and output the negative test control signal to the output terminal after inverting. The semiconductor apparatus may further include an OR circuit configured to receive an output of the positive pulse detection circuit and an output of the negative pulse detection circuit and output a logical sum to the output terminal.

In such a configuration, when receiving the positive test control signal and a positive memory writing/erasing voltage, the positive pulse detection circuit detects the positive test control signal and the positive memory writing/erasing voltage and output them to the output terminal. When receiving the negative test control signal and a negative positive memory writing/erasing voltage, the negative pulse detection circuit detects the negative test control signal and the negative memory writing/erasing voltage and output them after inverted. As such, the input terminal is used for inputs of the positive and negative test control signals as well as the positive and negative memory writing/erasing voltages, and the test control signals for any of the inputs can be output to the output terminal.

Accordingly, switching to a test mode and application of a memory writing voltage can be performed simultaneously. Also, the semiconductor apparatus is operable also in a case where the memory writing voltage is a negative voltage.

Hereinafter, embodiments of the present disclosure will be described with reference to the drawings.

First Embodiment

Hereinafter, a first embodiment will be described with reference to FIGS. 1 to 6. A semiconductor apparatus 1 of the present embodiment has a nonvolatile memory 100, a test control circuit 110, an internal circuit 120 and a semiconductor device 130 therein. The semiconductor apparatus 1 has an input terminal A as a pad to be connected to an external device. The semiconductor apparatus 1 is configured so that a writing/erasing voltage for the nonvolatile memory 100 and a test signal are input to the input terminal A, as input signals Vin.

Figure 1:
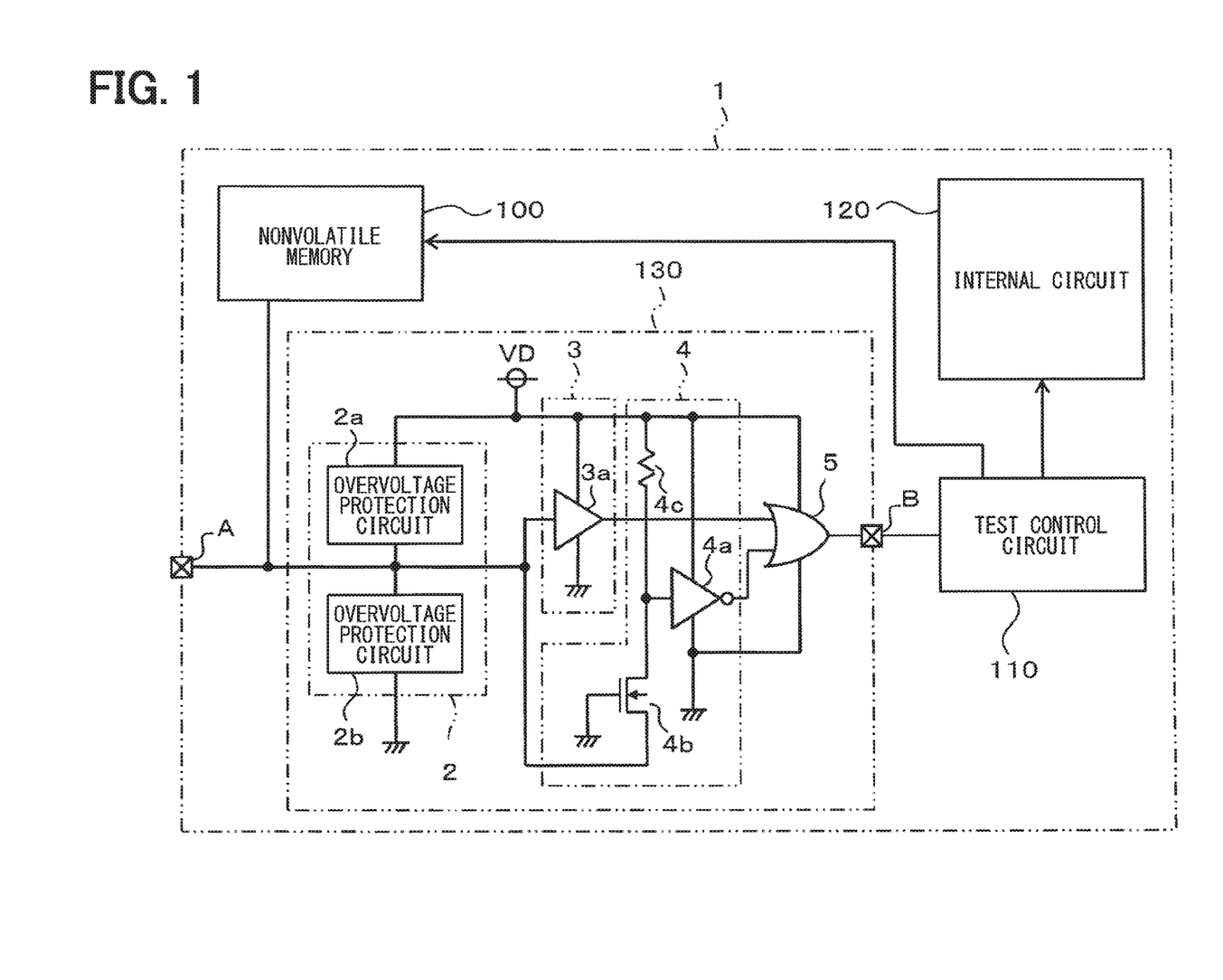
FIG. 1 is a diagram illustrating an electric configuration according to a first embodiment.

In FIG. 1, which shows the input terminal A and the configuration of an input stage, the input terminal A is connected to the nonvolatile memory 100, and is connected, via an overvoltage protection circuit 2, to a positive pulse detection circuit 3 and a negative pulse detection circuit 4. The overvoltage protection circuit 2 includes an overvoltage protection circuit 2a connected between the input terminal A and a power supply terminal VD, and an overvoltage protection circuit 2b connected between the input terminal A and a ground line. The overvoltage protection circuit 2 is provided for releasing a positive or negative overvoltage signal, as noise, entering from an external terminal A, to a power supply or a ground, via the overvoltage protection circuit 2a or 2b.

The positive pulse detection circuit 3 is a circuit including a buffer circuit 3a, and is supplied with power from the power supply terminal VD. When the input signal Vin from the input terminal A is higher than a positive threshold Vth+, the positive pulse detection circuit 3 generates a signal H at a high level, and provides the high level signal H to one of input terminals of an OR circuit 5. When the input signal Vin from the input terminal A is equal to or lower than the positive threshold Vth+, the positive pulse detection circuit 3 generates a signal L at a low level and provides the low level signal L to the one of the input terminals of the OR circuit 5.

The negative pulse detection circuit 4 includes an inverter circuit 4a, a MOSFET 4b, and a resistor 4c. A drain of the MOSFET 4b is connected to the power supply terminal VD via the resistor 4c. A source of the MOSFET 4b is connected to the input terminal A. A gate of the MOSFET 4b is connected to the ground. An input terminal of the inverter circuit 4a is connected to the drain of the MOSFET 4b, and an output terminal of the inverter circuit 4a is connected to the other one of the input terminals of the OR circuit 5. When the input signal Vin from the input terminal A is lower than a negative threshold Vth−, the negative pulse detection circuit 4 generates a signal H at a high level. When the input signal Vin from the input terminal A is equal to or higher than the negative threshold Vth−, the negative pulse detection circuit 4 generates a signal L at a low level.

When at least one of the buffer circuit 3a or the inverter circuit 4a outputs the high level signal H, the OR circuit 5 outputs a signal H at a high level to the output terminal B for a test control signal.

Next, the effects in the above-described configuration will be described also with reference to FIGS. 2 to 5.

Figure 2:
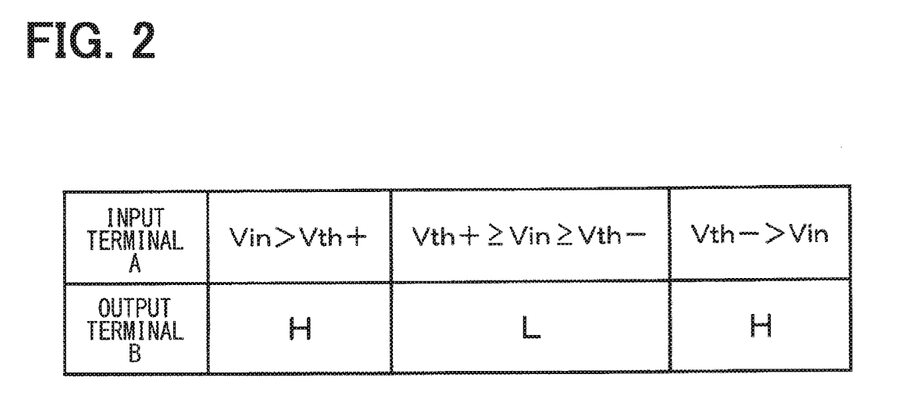
FIG. 2 is a diagram illustrating a relationship between an input signal and a threshold value.

Firstly, a basic operation will be described with reference to FIG. 2. It is assumed that, as the input signal Vin of the input terminal A, a positive pulse of a test mode is input. In this case, in the positive pulse detection circuit 3, when the level of the input pulse exceeds the threshold voltage Vth+, the buffer circuit 3a outputs the high level signal H. At this time, in the negative pulse detection circuit 4, the MOSFET 4b is kept in an off state irrespective of the state of the change in the positive pulse. Thus, the input terminal of the inverter circuit 4a is in a high level input state by the resistor 4c and the negative pulse detection circuit 4 is in the state of outputting the low level signal L.

Next, it is assumed that, as the input signal Vin of the input terminal A, a negative pulse of a test mode is input. In this case, in the negative pulse detection circuit 4, when the level of input pulse is lower than the negative threshold Vth−, the MOSFET 4b is turned on and the input terminal of the inverter circuit 4a is at the low level. Thus, the inverter circuit 4a outputs the high level signal H. That is, the negative pulse detection circuit 4 outputs the high level signal H as a signal by inverting the negative pulse to the positive pulse. At this time, in the positive pulse detection circuit 3, since the negative pulse does not exceed the threshold of the positive pulse detection circuit 3, the positive pulse detection circuit 3 is in a state of outputting the low level signal L irrespective of the state of the change in the negative pulse.

Next, cases where the input terminal A is applied with a positive memory writing/erasing voltage VPP or a negative memory writing/erasing voltage VBB, as the input signal Vin, will be described. When the positive memory writing/erasing voltage VPP is applied to the input terminal A, the positive pulse detection circuit 3 outputs the high level signal H. When the negative memory writing/erasing voltage VBB is applied to the input terminal A, the negative pulse detection circuit 4 outputs the high level signal H.

The OR circuit 5 outputs both of the high level signal H of the positive pulse detection circuit 3 and the high level signal H of the negative pulse detection circuit 4. As a result, as shown in FIG. 2, the OR circuit 5 outputs the high level signal H according to the high level signal of the positive pulse of the test mode and the positive memory writing/erasing voltage VPP to the output terminal B. Also, the OR circuit 5 outputs the high level signal H according to the high level signal of the negative pulse on the negative side of the test mode and the negative memory writing/erasing voltage VBB to the output terminal B.

Figure 3:
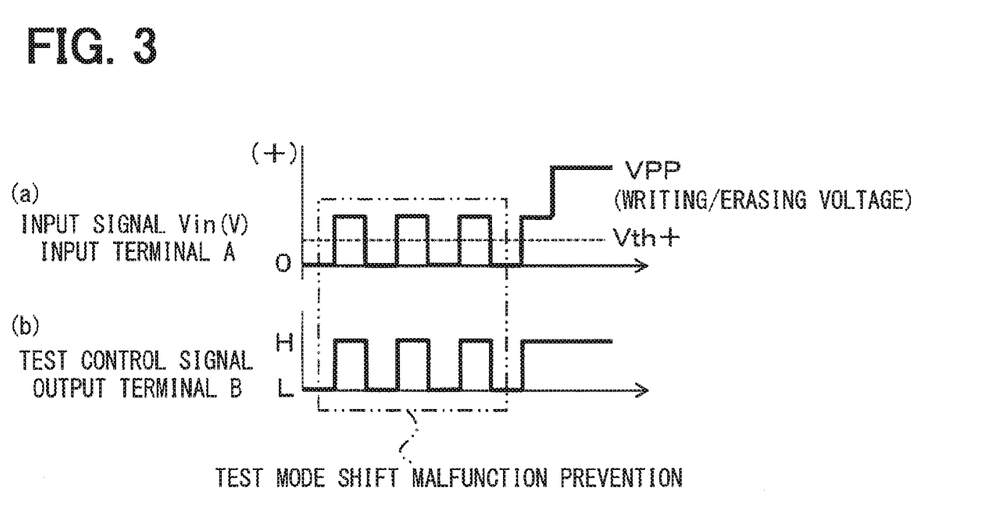
FIG. 3 is a time chart the input signal and an output signal in a case where a test control input and a writing voltage are continuously input, as an example (part 1)

FIG. 3 shows the output of the output terminal B in a case where three positive pulses and subsequently the positive memory writing/erasing voltage VPP are applied to the input terminal A as the input signal Vin. It should be noted that several times of positive pulses or negative pulses applied in this case are, for example, three times, and the positive pulses or the negative pulses applied at the several times are provided as measures for preventing malfunction, and are not for shifting to the test mode.

In a state where the positive pulses are input, the positive pulse detection circuit 3 outputs the high level signal H to the output terminal B when the positive pulses reach the high level H. In addition, when the positive memory writing/erasing voltage VPP at a high level is applied following the input state of the three positive pulses, the positive pulse detection circuit 3 continues to output the high level signal H to the output terminal B.

Figure 4:
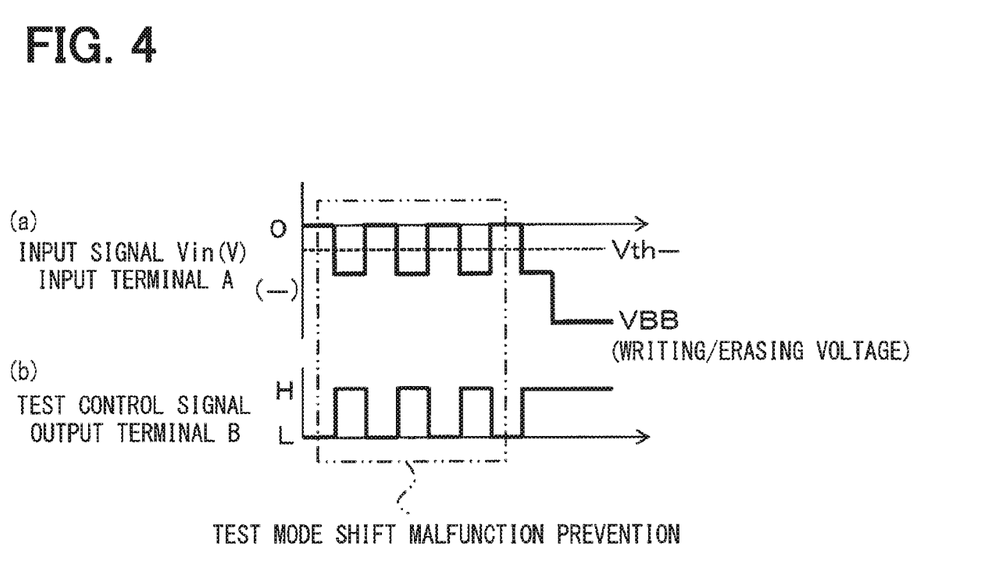
FIG. 4 is a time chart of the input signal and the output signal in a case where the test control input and the writing voltage are continuously input, as an example (part 2)

FIG. 4 shows the output of the output terminal B in a case where three negative pulses and subsequently the negative memory writing/erasing voltage VBB are applied to the input terminal A as the input signal Vin. In a state where the negative pulses are input, the negative pulse detection circuit 4 outputs the high level signal H to the output terminal B when the negative pulses reach the high level H. In addition, when the negative memory writing/erasing voltage VBB at a high level on the negative side is applied following the input state of the negative pulses, the negative pulse detection circuit 4 continues to output the high level signal H to the output terminal B.

Figure 5:
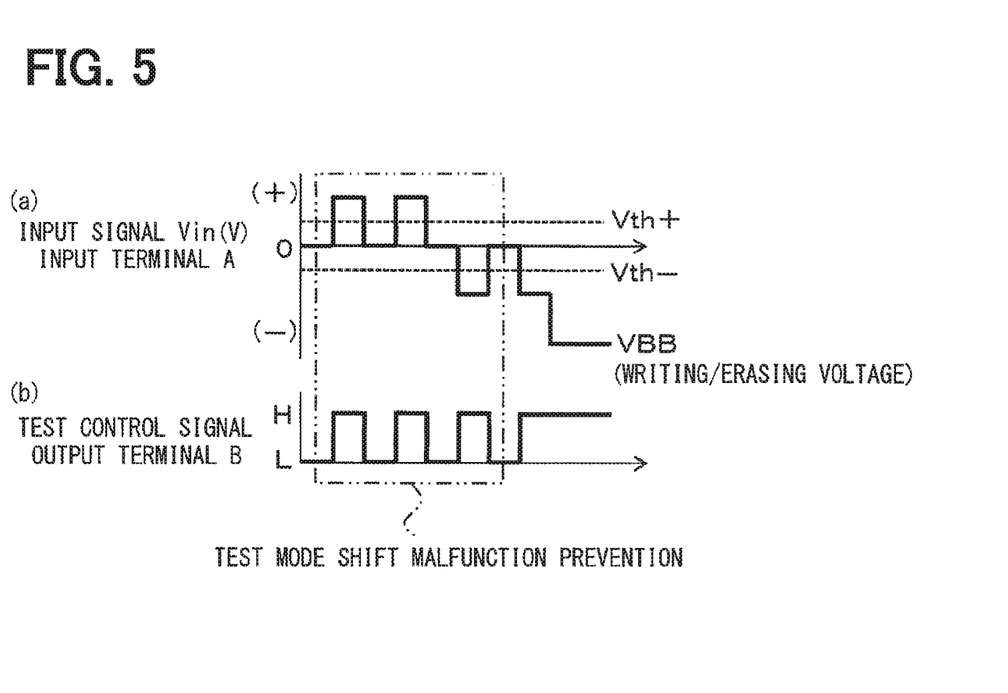
FIG. 5 is a time chart of the input signal and the output signal in a case where the test control input and the writing voltage are continuously input, as an example (part 3)

FIG. 5 shows the output of the output terminal B in a case where two positive pulses, subsequently one negative pulse, and then the negative memory writing/erasing voltage VBB are applied to the input terminal A as the input signal Vin. In the state where the positive pulses and the negative pulse are input, each of the positive pulse detection circuit 3 and the negative pulse detection circuit 4 outputs the high level signal H to the output terminal B when the positive pulses or the negative pulse reach the high level H. In addition, when the negative memory writing/erasing voltage VBB at the high level on the negative side is applied following the input state of the negative pulse, the negative pulse detection circuit 4 continues to output the high level signal H to the output terminal B.

Figure 6:
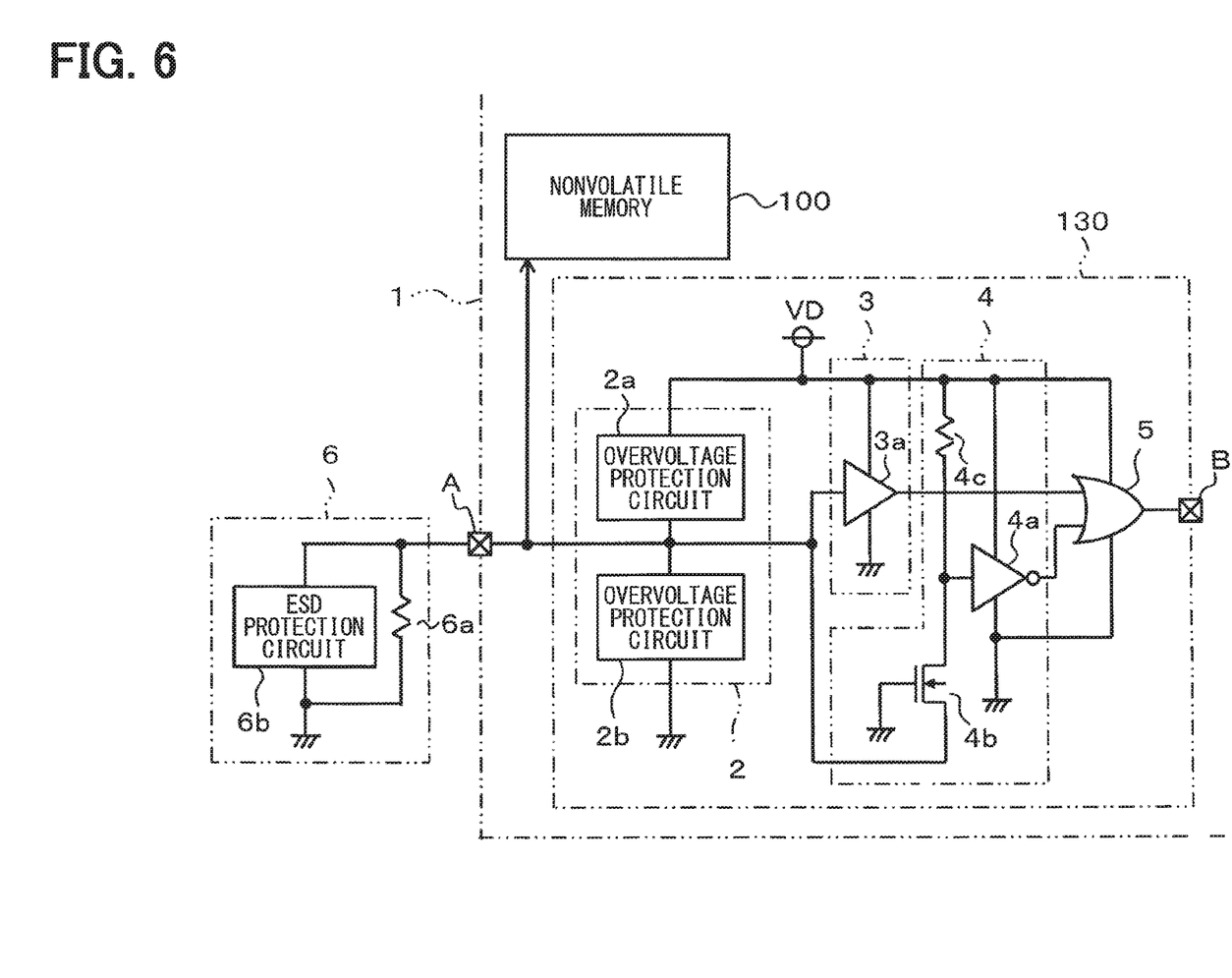
FIG. 6 is a diagram illustrating an electric configuration in which a pull-down resistor and an ESD protection circuit are added.

FIG. 6 shows an example of use of the semiconductor apparatus 1 configured as described above. In this configuration, the protection circuit 6 is externally attached to the input terminal A of the semiconductor apparatus 1. The protection circuit 6 includes a resistor 6a for pulling down the input terminal A and an electro static discharge (ESD) protection circuit 6b. As a result, in the state where there is no input to the input terminal A, the potential can be fixed to the ground level by the pull-down resistor 6a, so an erroneous operation can be suppressed. The ESD protection circuit 6b can protect the semiconductor apparatus 1 from electrostatic discharge entering the input terminal A.

As described above, according to the present embodiment, since the semiconductor apparatus 1 has the positive pulse detection circuit 3 and the negative pulse detection circuit 4, in the configuration in which the input terminal A is shared for input of the memory writing/erasing voltage and input of the test signal, the semiconductor apparatus 1 is operable for both of the positive pulse and the negative pulse. In addition, when the memory writing/erasing voltages VPP and VBB are inputted, it is possible to execute writing or erasing process on the memory while maintaining the level of the output terminal B at the high level.

Second Embodiment

Figure 7:
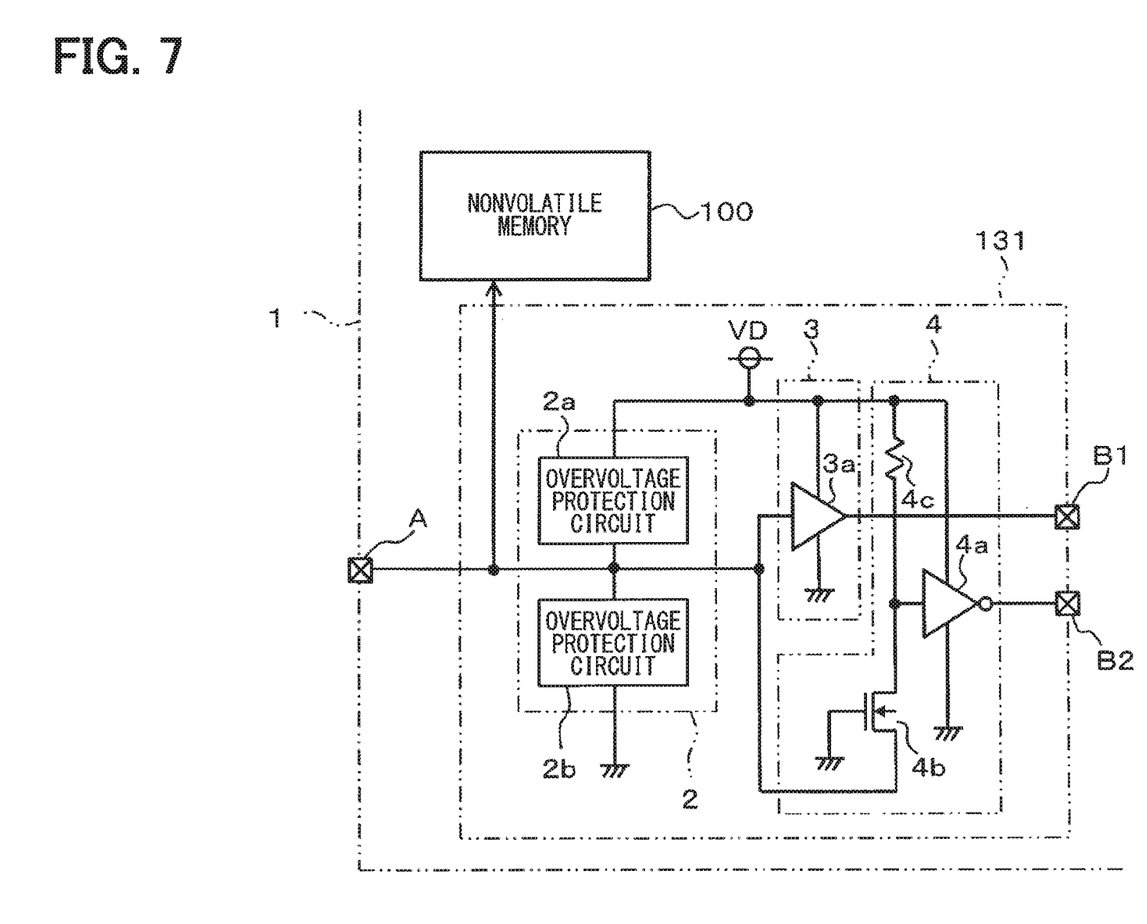
FIG. 7 is a diagram illustrating an electric configuration according to a second embodiment.
Figure 8:
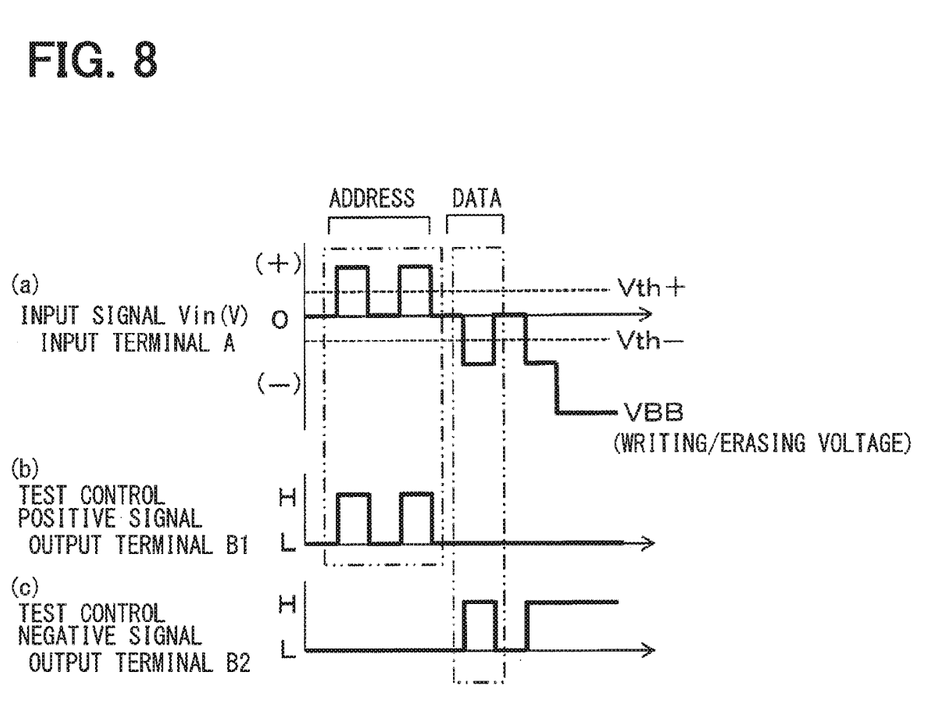
FIG. 8 is a time chart of an input signal and an output signal in a case where a test control input and a writing voltage are continuously input, as an example.

FIGS. 7 and 8 show a second embodiment, and portions different from the first embodiment will be described hereinafter. In the present embodiment, as shown in FIG. 7, a semiconductor device 131 is not provided with the OR circuit 5. Further, the semiconductor device 131 is configured such that the output of the positive pulse detection circuit 3 is provided to an output terminal B1, and the output of the negative pulse detection circuit 4 is provided to an output terminal B2.

By adopting the above-described configuration, in regard to the test signal and the memory writing/erasing voltages VPP, VBB as the input signals Vin to the input terminal A, the outputs in response to the positive pulse of the test signal and the positive memory writing/erasing voltage VPP are provided to the output terminal B1, and the outputs in response to the negative pulse of the test signal and the negative memory writing/erasing voltage VBB are provided to the output terminal B2. As a result, it is possible to separately output the positive pulse and the negative pulse by the output terminals B1 and B2.

FIG. 8 shows an example of the outputs of the output terminals B1 and B2 of the case where, as the input signals Vin to the input terminal A, an address is input with a positive pulse, data is subsequently input with a negative pulse, and thereafter, the negative memory writing/erasing voltage VBB is input. When the positive pulse of the address is inputted to the input terminal A, the input to the input terminal A is detected by the positive pulse detection circuit 3, and a signal corresponding to the address is output from the output terminal B1.

When the negative pulse of the data is input to the input terminal A, the input to the input terminal A is detected by the negative pulse detection circuit 4, and is output from the output terminal B2 as the positive pulse after inverted its positive and negative states. Subsequently, when the negative memory writing/erasing voltage VBB is input to the input terminal A, the input to the input terminal A is detected by the negative pulse detection circuit 4, and thus the high level signal is continuously output from the output terminal B2.

Also in the second embodiment, similarly to the first embodiment, the positive and negative pulses and the memory writing/erasing voltage VBB can be input as the input signals Vin through the same input terminal A.

According to the second embodiment, the output of the positive pulse detection circuit 3 is provided to the output terminal B1, and the output of the negative pulse detection circuit 4 is provided to the output terminal B2. Therefore, the positive pulse and the negative pulse of the test mode can be distinguishably detected, and separately output.

Third Embodiment

Figure 9:
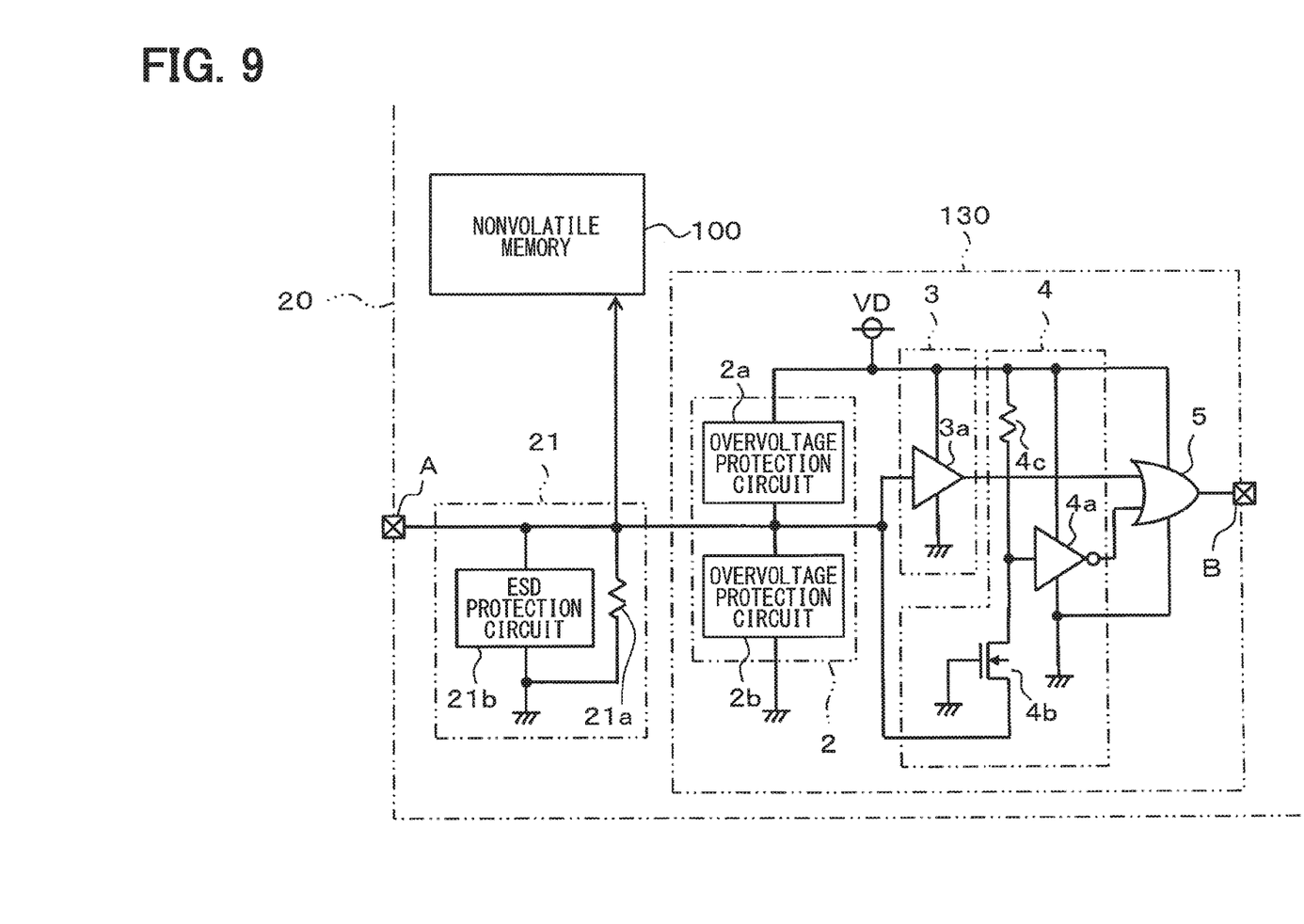
FIG. 9 is a diagram illustrating an electric configuration according to a third embodiment.

FIG. 9 shows a third embodiment, and portions different from the first embodiment will be described hereinafter. In the present embodiment, a semiconductor apparatus 20 has a protection circuit 21. The protection circuit 21 has a similar structure to the protection circuit 6 of the first embodiment, which is externally connected to the semiconductor apparatus 1 as shown in FIG. 6. The protection circuit 21 is provided inside the semiconductor apparatus 20.

In the configuration shown in FIG. 9, the semiconductor apparatus 20 has the protection circuit 21 that is connected on an input path of a writing/erasing voltage from the input terminal A to the nonvolatile memory 100 and on an input path from the input terminal A to the overvoltage protection circuit 2. The protection circuit 21 includes a pull-down resistor 21a for fixing the potential level of the input terminal A and an ESD protection circuit 21b.

According to the third embodiment, since the protection circuit 21 is integrally provided inside the semiconductor apparatus 20, in a state where the input terminal A has no input, the potential level can be fixed to the ground level by the pull-down resistor 21a. Therefore, it is possible to suppress an erroneous operation. In addition, the ESD protection circuit 21b can shut off noise entering the input terminal A.

Fourth Embodiment

Figure 10:
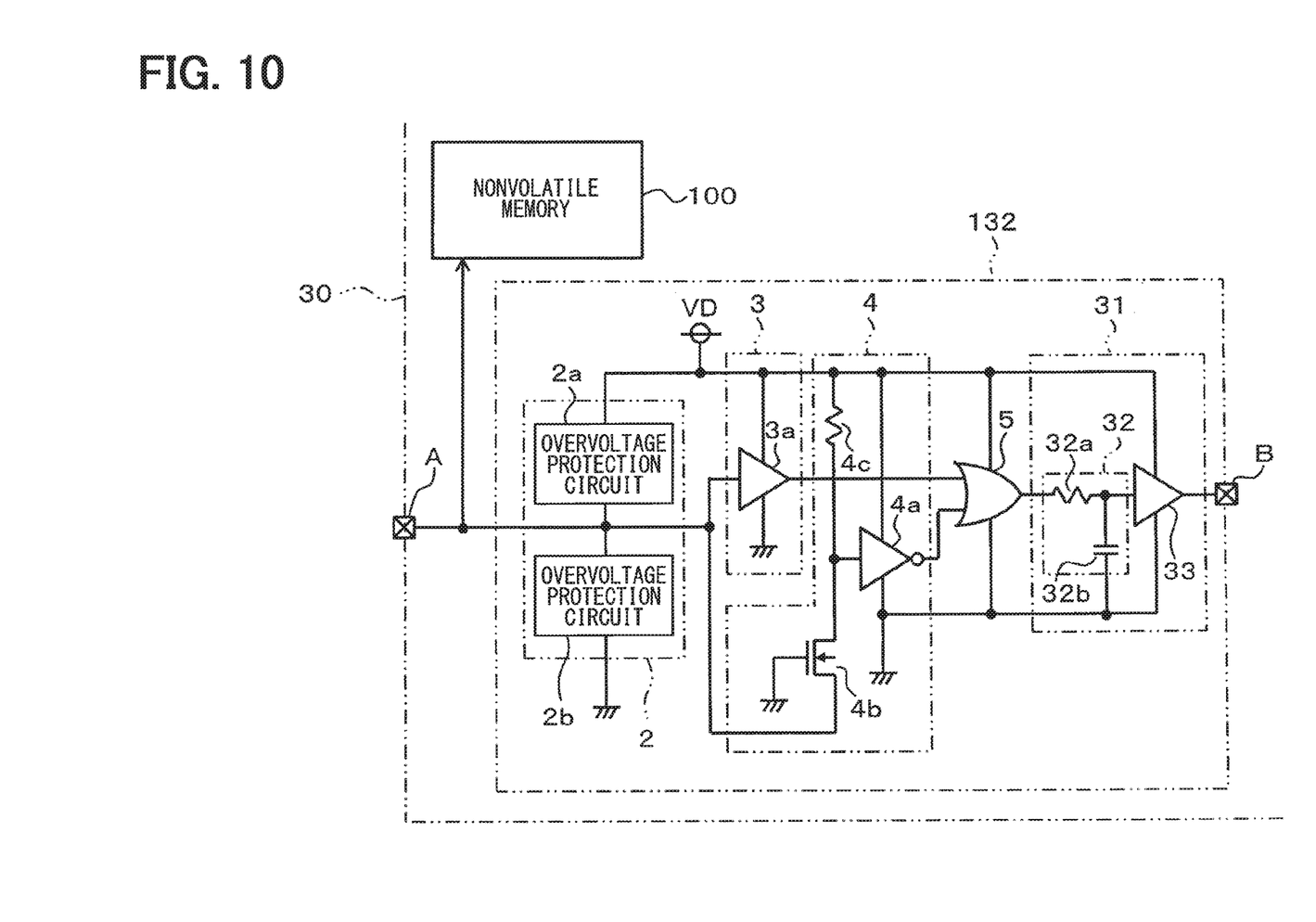
FIG. 10 is a diagram illustrating an electric configuration according to a fourth embodiment.
Figure 11:
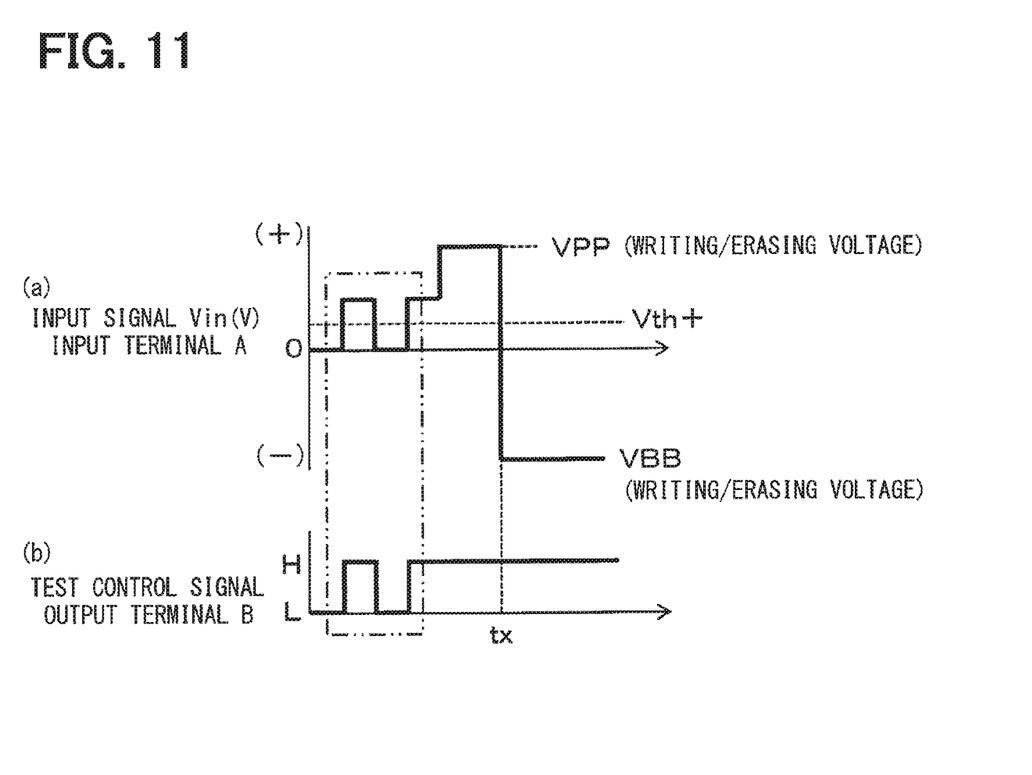
FIG. 11 is a time chart of an input signal and an output signal in a case where a test control signal and a writing voltage are continuously input, as an example.

FIGS. 10 and 11 show a fourth embodiment, and portions different from the first embodiment will be hereinafter described. In the present embodiment, a semiconductor apparatus 30 has an output circuit 31 between the output terminal of the OR circuit 5 and the output terminal B of a semiconductor device 132.

As shown in FIG. 10, the output circuit 31 includes a low-pass filter 32 and a buffer circuit 33. The low-pass filter 32 includes a resistor 32a and a capacitor 32b. The low-pass filter 32 is connected between the output terminal of the OR circuit 5, via the resistor 32a, and the input terminal of the buffer circuit 33. The output terminal of the buffer circuit 33 is connected to the output terminal B.

In such a configuration, in a case where the output signal of the OR circuit 5 instantaneously changes from the high level state to the low level and returns to the high level or a case vice versa, the instantaneous change is not transmitted to the output terminal B, and the state before the change can be kept.

FIG. 11 shows an example of the above pattern, in which the input signal Vin to the input terminal A changes from the positive pulse to the positive memory writing/erasing voltage VPP and thereafter changes to the negative memory writing/erasing voltage VBB. When the input signal Vi changes from the positive pulse to the positive memory writing/erasing voltage VPP, as described above, since this change is detected by the positive pulse detection circuit 3, a high level output signal can be obtained corresponding to the voltage VPP from the output corresponding to the pulse signal.

Thereafter, at the time tx shown in FIG. 11, when the input signal Vin changes from the positive memory writing/erasing voltage VPP to the negative memory writing/erasing voltage VBB, the high level signal output from the positive pulse detection circuit 3 temporarily disappears. Thereafter, as the voltage VBB is detected by the negative pulse detection circuit 4, the output signal returns to the high level again. In this case, when the voltage changes from positive to negative, the output of the OR circuit 5 instantaneously changes to the low level. However, since this change is absorbed by the low pass filter 32, a high level signal having a slight variation is maintained. When the level of the input exceeds the threshold Vth+, the buffer circuit 33 keeps the signal output state to the output terminal B at the high level.

According to the fourth embodiment, since the output circuit 31 having the low-pass filter 32 and the buffer circuit 33 is provided at the output stage, the writing/erasing voltage can be switched from the positive voltage VPP to the negative voltage VBB while keeping the output of the output terminal B at the high level of enable.

Fifth Embodiment

Figure 12:
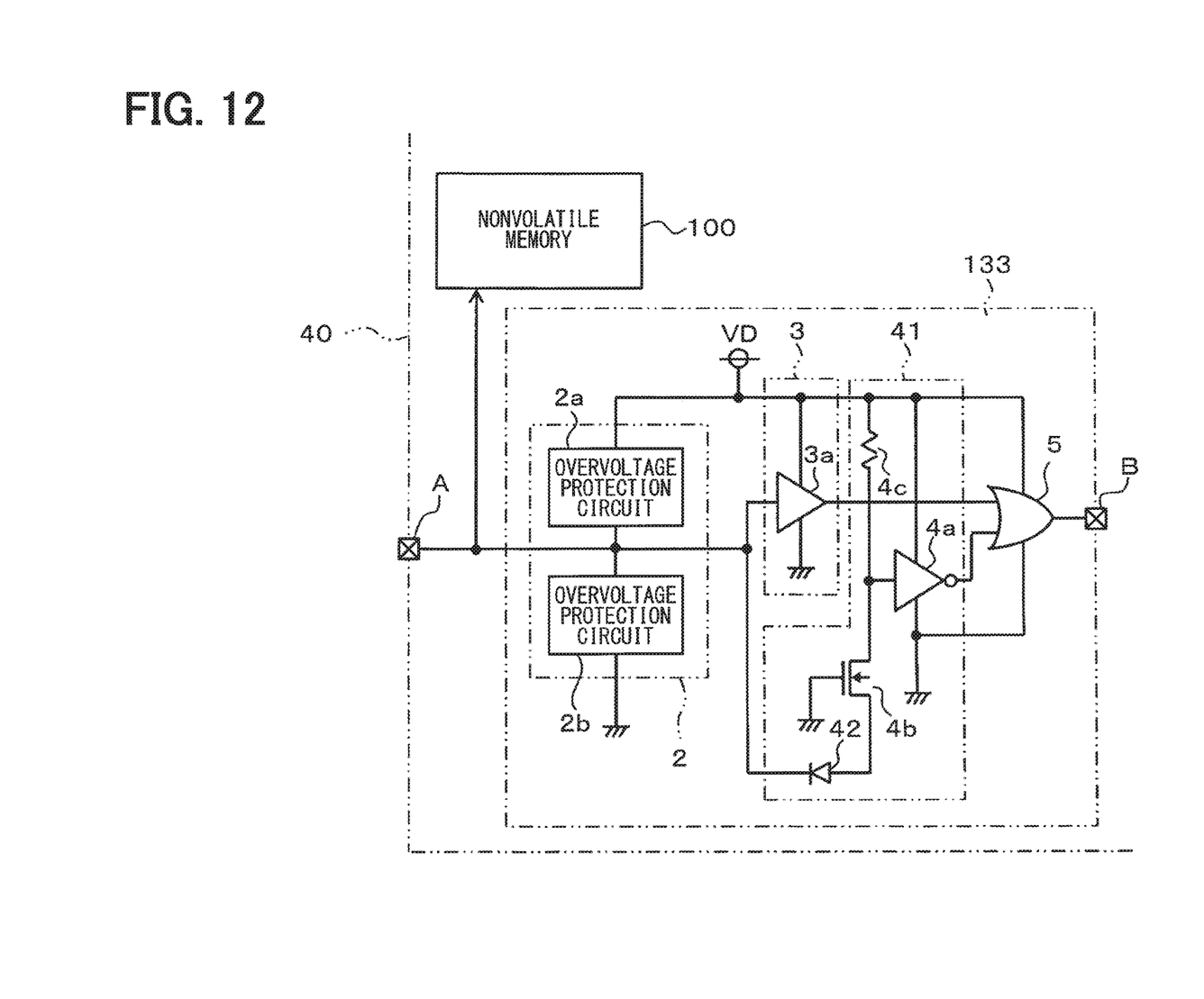
FIG. 12 is a diagram illustrating an electric configuration according to a fifth embodiment.

FIG. 12 shows a semiconductor apparatus 40 according to a fifth embodiment. The semiconductor apparatus 40 of the fifth embodiment is different from the first embodiment in that a negative pulse detection circuit 41 is provided, in place of the negative pulse detection circuit 4, in a semiconductor device 133. As shown in FIG. 12, in the negative pulse detection circuit 41, a diode 42 is interposed in a path from the input terminal A to the source of the MOSFET 4b. An anode of the diode 42 is connected to the source of the MOSFET 4b, and a cathode of the diode 42 is connected to the input terminal A.

According to the above configuration, when the input signal Vin to the input terminal A is negative, the MOSFET 4b turns on at a timing of reaching the sum of the forward voltage Vf of the diode 42 and the threshold voltage of the MOSFET 4b. In other words, by providing the diode 42, it is possible to adjust the threshold voltage Vth− for detecting the negative pulses.

According to the fifth embodiment, it is possible to obtain advantageous effects similar to those of the first embodiment. In addition, since the negative pulse detection circuit 41 is provided with the diode 42, the threshold voltage for detecting the negative pulses can be adjusted.

Other Embodiments

The present disclosure is not limited to the embodiments described hereinabove, but may be suitably adopted to various embodiments without departing from the gist of the present disclosure. For example, the present disclosure can be modified or expanded as follows.

The configuration of having the output terminals B1 and B2 as indicated in the second embodiment can be applied to the third embodiment, the fourth embodiment or the fifth embodiment.

The configuration of integrating the protection circuit 21 as indicated in the third embodiment can be applied to the fourth embodiment or the fifth embodiment.

The configuration of having the output circuit 31 as indicated in the fourth embodiment can be applied to the fifth embodiment.

In the configuration of the negative pulse detection circuit 41 provided with the diode 42 as in the fifth embodiment, two or more diodes can be employed and connected in series for a purpose of adjusting the threshold voltage.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A semiconductor apparatus including a nonvolatile memory therein and an input terminal that receives a test control signal and an input signal of a writing/erasing voltage for the nonvolatile memory from an external device, the semiconductor apparatus comprising:
   an output terminal that outputs a signal to another circuit provided in the semiconductor apparatus;
   a positive pulse detection circuit that detects a positive test control signal received at the input terminal, and that outputs the positive test control signal to the output terminal;
   a negative pulse detection circuit that detects a negative test control signal received at the input terminal, and that outputs the negative test control signal to the output terminal after inverting; and
   an OR circuit that receives an output of the positive pulse detection circuit and an output of the negative pulse detection circuit and that outputs a logical sum to the output terminal.

2. The semiconductor apparatus according to claim 1, further comprising:
   a low-pass filter that allows a low frequency component of an output signal of the OR circuit; and
   a buffer circuit that outputs an output signal of the low-pass filter after determining with a predetermined threshold.

3. The semiconductor apparatus according to claim 1, further comprising:
   a pull-down resistor provided between the input terminal and a ground.

4. The semiconductor apparatus according to claim 2, further comprising:
   a pull-down resistor provided between the input terminal and a ground.

* * * * *